(12) United States Patent
Vogel et al.

(10) Patent No.: US 6,317,326 B1
(45) Date of Patent: Nov. 13, 2001

(54) INTEGRATED CIRCUIT DEVICE PACKAGE AND HEAT DISSIPATION DEVICE

(75) Inventors: Marlin R. Vogel, Brentwood; David G. Love, Pleasanton, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/661,969

(22) Filed: Sep. 14, 2000

(51) Int. Cl.[7] ..................................................... H05K 7/20
(52) U.S. Cl. ......................... 361/704; 361/699; 361/690; 361/698; 361/717; 165/80.4; 257/712; 257/713; 257/714; 257/721; 257/722; 174/15.1; 174/16.3
(58) Field of Search ...................................... 361/689, 690, 361/698, 699, 702, 704, 709, 711, 714, 718, 719; 257/704, 706, 707, 712–714, 721, 722; 144/15.1, 15.2, 16.1, 16.3; 165/80.2, 80.3, 80.4, 104.33, 185

(56) References Cited

U.S. PATENT DOCUMENTS 5,268,814 * 12/1993 Yakubowski ........................ 361/704
5,285,351 * 2/1994 Ikeda .................................... 361/699
5,291,064 * 3/1994 Kurokawa ............................ 257/714
5,345,107 * 9/1994 Daikoku et al. ..................... 257/717
5,528,456 * 6/1996 Takahashi ............................ 361/704
5,705,850 * 1/1998 Ashiwake et al. ................... 257/714
5,880,524 * 3/1999 Xie ....................................... 257/704
5,923,086 * 7/1999 Winer et al. ......................... 257/713

FOREIGN PATENT DOCUMENTS 0 447 835 A2 * 9/1991 (EP) ............................ H01L/23/473

* cited by examiner

Primary Examiner—Leo P. Picard
Assistant Examiner—Boris L. Chervinsky
(74) Attorney, Agent, or Firm—Bernice B. Chen

(57) ABSTRACT

An integrated circuit device package is integrated with a heat dissipation member to reduce the number of junctions in a packaged integrated circuit device. For example, the integrated circuit device package may include a substrate and a thermally conductive lid coupled to a first surface of the substrate, forming a closed cavity which encloses an integrated circuit die. The thermally conductive lid may be integrated with the heat dissipation member.

17 Claims, 5 Drawing Sheets

US 6,317,326 B1

INTEGRATED CIRCUIT DEVICE PACKAGE AND HEAT DISSIPATION DEVICE

FIELD OF THE INVENTION

This invention relates to heat dissipation of an integrated circuit device, in particular, to integrating an integrated circuit device package with a heat dissipation device.

BACKGROUND OF THE INVENTION

Integrated circuitry fabricated on semiconductor chips generates heat during normal operation. If the heat generated becomes excessive or the heat generated is not effectively removed, the integrated circuit device can malfunction or fail. In other words, the reliability of the integrated circuit device may be compromised if the integrated circuit device overheats. There are many ways to remove heat from an integrated circuit device, for example, by placing the integrated circuit device in a cool spot in the enclosure or using a liquid-cooled plate connected to a refrigerated water chiller. In general, the amount of heat generated by the integrated circuit device, the integrated circuit device package configuration and the expected lifetime of the product combine with many other factors determine the optimum heat removal scheme.

The interface between the integrated circuit device and the heat dissipation device used to cool the integrated circuit device may be a factor in designing a thermal solution. More specifically, microscopic air gaps (e.g., caused by surface non-uniformity) between an integrated circuit device package and a heat sink attached to the integrated circuit device package's surface may affect or degrade thermal performance. Typically, the degradation in thermal performance increases as the operating temperature increases. The surface variability induced by varying surface roughness may be reduced by using interface materials appropriate to the package type. However, it is difficult, if not impossible, to completely eliminate the surface variability.

The development of faster and denser circuit technologies and smaller packages which are accompanied by increasing heat fluxes at the chip and package levels complicate the problem. Although significant advances have been made in air cooling techniques to manage increased heat fluxes, it has long been recognized that significantly higher heat fluxes are better accommodated through the use of liquid cooling.

FIG. 1 shows an electronic device 100 having a cavity-up design. A flip-chip 106 is bonded to a substrate 102 via flip-chip bumps 108. A lid 110, which can be multi-component or one component is attached to substrate 102 via adhesive 112. Lid 110 provides mechanical structure strength to the device. A cold plate 116 is attached to lid 110 with an adhesive 120.

Cold plate 116 is constructed of a cap 116a and a base 116b. Base 116b includes fins 116c and cap 116a includes an inlet 122 and an outlet 124. Cap 116a is attached to base 116b through an adhesive 121, forming channels 116d. Electronic device 100 may be coupled to a printed circuit board (PCB) via Ball Grid Array (BGA) balls 104.

In FIG. 1, the thermal path for dissipating heat generated by flip-chip 106 includes adhesive 114, lid 110 and adhesive 120. Each junction/interface (e.g., between flip-chip 106 and lid 110, between lid 110 and cold plate 116) causes a junction temperature which is undesirable because junction temperatures increase the impedance of the thermal path, thus decrease thermal dissipation efficiency.

In some instances, where thermal requirements cannot be met with the added junction temperature caused by the adhesive between the lid and the adhesives, the lid may be eliminated all together and a cold plate directly attached to the silicon substrate. Although the resulting structure eliminates the junction temperature caused by the lid, the elimination of the lid also eliminates the mechanical strength provided by the lid, resulting in a weak structure.

SUMMARY OF THE INVENTION

The invention relates to methods and apparatus to increase heat dissipation of an integrated circuit device while retaining mechanical strength of the integrated circuit device.

In accordance with the invention, an integrated circuit device package is integrated with a heat dissipation member to reduce the number of junctions in the packaged integrated circuit device. In one embodiment of the present invention, the integrated circuit device package includes a substrate, a semiconductor chip mounted on a first surface of the substrate, and a thermally conductive lid integrated with a first heat dissipation member coupled to the first surface of the substrate, thereby forming a closed cavity between the thermally conductive lid and the substrate. The semiconductor chip is enclosed in the closed cavity.

In one embodiment, the integrated circuit device package includes a second heat dissipation member which is coupled between the thermally conductive lid and the first heat dissipation member. In one embodiment, the second heat dissipation member and the thermally conductive lid form at least one thermal interface gap at a location corresponding to the amount of heat dissipation of the semiconductor chip.

This summary is not intended to limit the scope of the invention, which is defined solely by the claims attached hereto.

While specific embodiments are described and illustrated herein, these embodiments are not intended to limit the scope of the invention, which is susceptible to various modifications and alternative forms.

DETAILED DESCRIPTION OF THE INVENTION

Methods and apparatus for dissipating heat from a semiconductor chip are provided. In accordance with the present invention, an integrated circuit device package is integrated with a heat dissipation member, thereby reducing the number of junctions in the packaged integrated circuit device.

Figure 1:
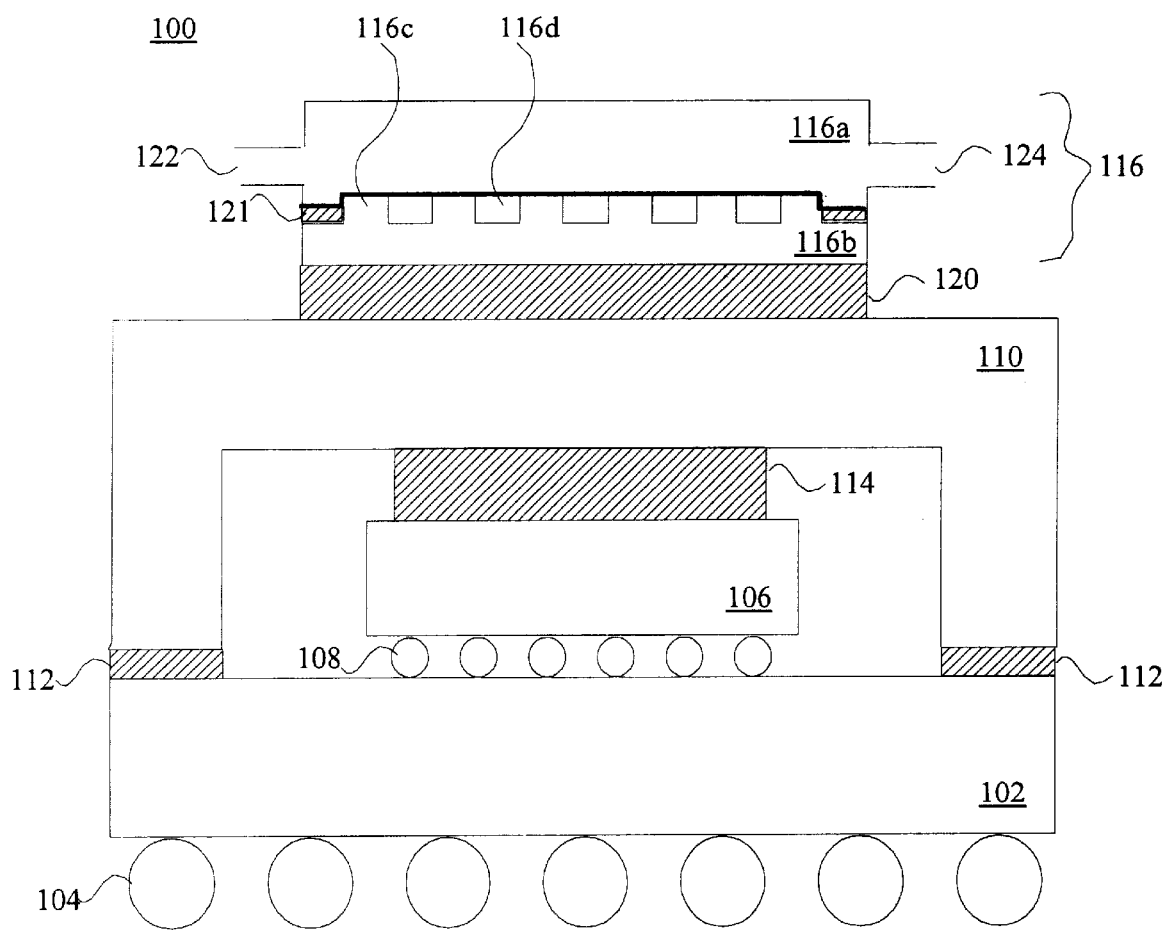
FIG. 1 illustrates a prior art integrated circuit device package coupled to a heat dissipation member through an adhesive.
Figure 2A:
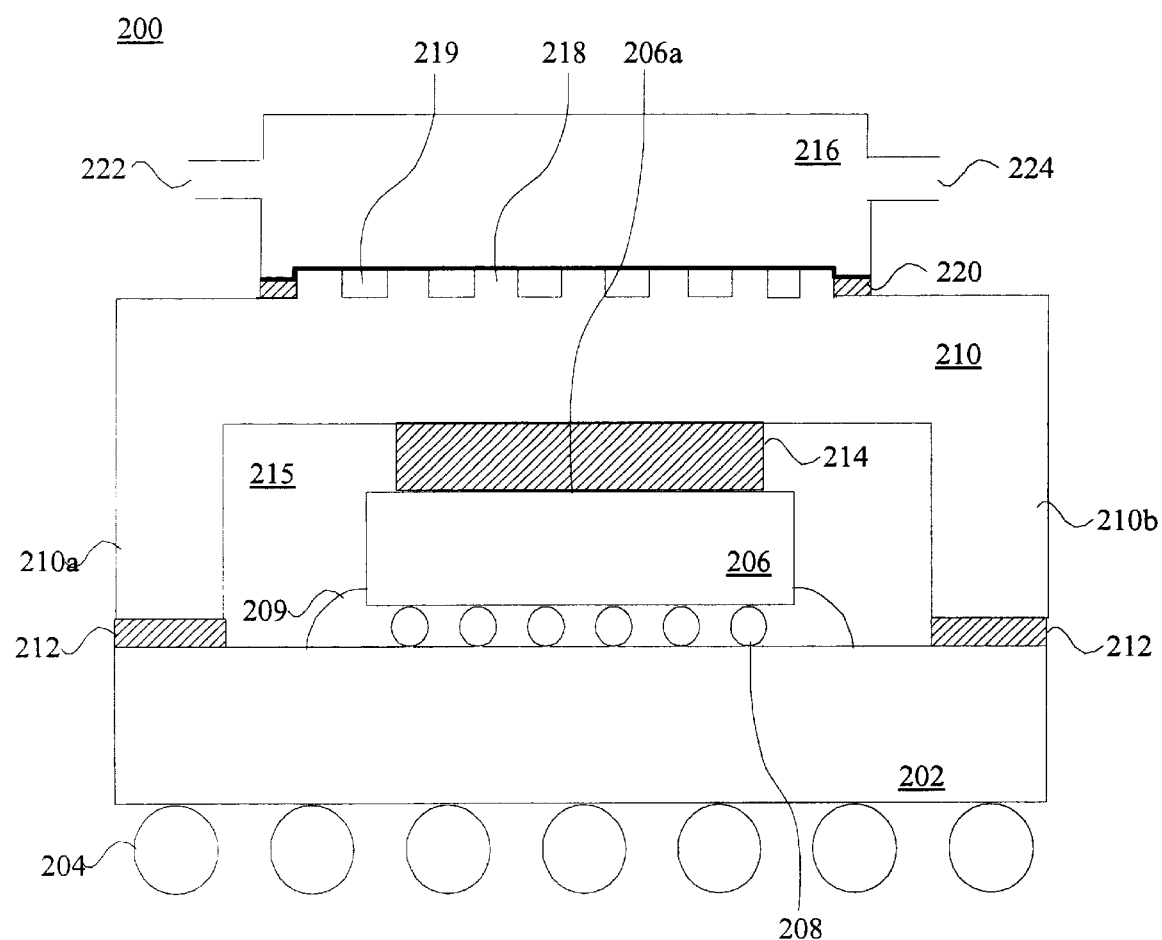
FIG. 2A illustrates an integrated circuit device package integrated with a cold plate in accordance with the present invention.

FIG. 2A shows a packaged integrated circuit in accordance with one embodiment of the present invention. A semiconductor chip 206 is mounted in a conventional flip-chip configuration. Flip-chip configuration is a surface mount technology where semiconductor chip 206 is packaged in place on a substrate 202 with an underfill 209. Flip-chip 206 may also be mounted on glass substrates using conductive paste, typically for LCD drivers and smart cards.

Semiconductor chip 206 may include integrated circuitry fabricated on a monocrystalline silicon substrate. The integrated circuitry on semiconductor chip 206 may be electrically connected to chip solder bump array 208 via a multi-layer interconnect structure (not shown) which is fabricated over a silicon substrate in accordance with conventional semiconductor processing techniques. Chip solder bump array 208 is also electrically connected to electrically conductive traces (not shown) which are located on the upper surface of substrate 202.

Substrate 202 may include alternating layers of electrically insulating material and electrically conductive traces (not shown) which are connected in a manner known in the art, to provide conductive pathways from the upper surface of substrate 202 to the lower surface of substrate 202. In one embodiment, the conductive layers of substrate 202 are copper and the insulating layers are made of conventional fire retardant resin-glass cloth laminate (designated FR-4 by the Electronic Industries Association). In another embodiment, substrate 202 includes alternating layers of copper and insulating epoxy. Other suitable combination of electrically conductive and insulating materials may also be used to construct substrate 202.

Underfill 209, which is typically epoxy resin, is located around the perimeter of semiconductor chip 206. Underfill 209 joins semiconductor chip 206 to the interconnect structure in substrate 202 and adds rigidity and strength to substrate 202. Underfill 209 may be other suitable materials.

As previously described, the conductive layers of substrate 202 extend to the lower surface of substrate 202. The solder balls of package solder ball array 204 provide electrically conductive paths between the conductive traces on the lower surface of substrate 202 and conductive traces located on the upper surface of a printed circuit board (PCB, not shown).

A thermally conductive lid 210 is attached to upper surface 206a (i.e., the backside) of semiconductor chip 206 via a thermally conductive adhesive 214. Thermally conductive lid 210 may be formed of aluminum, copper, copper tungsten, copper molybdenum, or other suitable materials. Thermally conductive lid 210 provides mechanical strength to structure 200.

Thermally conductive adhesive 214 should be compatible with the lid material and may be any conventional thermally conductive adhesives (paste or tape), greases, or solder materials. In general, thermally conductive adhesive 214 should have high dielectric strength, high thermal conductivity and sufficient pliancy to conform to both microscopic and macroscopic surface irregularities of semiconductor chip 206 and thermally conductive lid 210. Thermally conductive adhesive 214 should also be sufficiently durable to survive a variety of assembly, use, and environmental conditions. The optimal adhesive material for a specific application generally depends on volume production requirements, processing limitations, and functional and performance requirements (e.g., thermal transfer rates vs. cost). Thermally conductive adhesive 214 may be thermal greases, pads and adhesives with filler materials (i.e., conductive metal particles) such as, but not limited to, zinc oxide, silver, aluminum, aluminum oxide, aluminum nitride, boron nitride, magnesium oxide, and diamond. For example, thermally conductive adhesive 214 may be epoxy, silicone or polyimide filled with silver. The thickness of thermally conductive adhesive 214 depends on the type of the adhesive chosen and the specific use. Heat generated by semiconductor chip 206 during normal operating conditions is transferred to thermally conductive lid 210 through thermally conductive adhesive 214.

In one embodiment, thermally conductive lid 210 includes portions 210a and 210b which extend downward toward substrate 202. An adhesive 212, having a composition similar to that of adhesive 214, connects downward extending portions 210a and 210b of thermally conductive lid 210 to substrate 202 to define a closed cavity 215 which completely encloses semiconductor chip 206.

In accordance with one embodiment of the present invention, instead of a relatively planar upper surface a conventional lid employs, thermally conductive lid 210 includes fins 218 protruding from the upper surface of conductive lid 210. The combination of a lid and fins also act as the bottom plate of a conventional cold plate. A cap 216 with an inlet 222 and an outlet 224 is attached to thermally conductive lid 210 using, for example, an adhesive 220 around the perimeter of cap 216. Cap 216 acts as the top plate of a conventional cold plate. Cap 216 may also be attached to thermally conductive lid 210 by using, for example, welding, brazing, soldering or diffusion bonding. If solder is chosen, solder melting temperature should be lower than the melting point of the chip solder bump array 208 so that the solder does not remelt during the reflow process, e.g., below 183 degrees Celsius for tin solder. Those skilled in the art would recognize that solder melting temperature is not a concern if the lid and cap are joined prior to attachment to the package.

Diffusion bonding bonds two dissimilar metals. If diffusion bonding is chosen, the metals should be selected such that they exhibit, for example, high diffusion rate of one into the other at relatively low temperatures (e.g., 100–150 degrees centigrade) and similar density. The joint materials and bonding method should not form inter-metallic compounds. Some examples of diffusion bonding metal combinations are aluminum/cadmium, aluminum/gallium, aluminum/nickel, aluminum/tin, and aluminum/zinc. Other suitable combinations of metals may be used as well.

Cap 216 may be attached to thermally conductive lid 210 during the packaging process. In the alternative, cap 216 may be attached to thermally conductive lid 210 during the lid manufacturing process and the lid/cap combination is then attached to substrate 202 during the packaging process.

A conventional cold plate is formed by gluing or brazing a cap and a bottom piece together. The cold plate is then attached to a lid through an adhesive material. In contrast to the conventional cold plate, the bottom piece of the cold plate in accordance with the present invention is integrated with the lid. The cap is then glued or brazed to the combined lid/bottom piece. The interface area and junction between the lid and the cap is minimal.

The dimensions of cap 216, inlet 222 and outlet 224 depend on specific construction and are application specific. Heat may be dissipated from semiconductor chip 206 to the combined lid/bottom piece. Coolant flows enters inlet 222, through plenums (not shown) into channels 219, then exits outlet 224 to assist heat dissipation from semiconductor chip 206.

The coolant may be, but is not limited to, water, air, freon, and fluorinated carbon liquids (e.g., FC-72, FC-86, FC-77, etc.).

The structure shown in FIG. 2A effectively eliminates or minimizes junction temperature caused by adhesives between a cold plate and a lid. For a high performance semiconductor chip such as a central processing unit (CPU), the elimination or minimization of this junction between thermally conductive lid 210 and cap 216 can reduce the junction temperature significantly, e.g., 10 to 15 degrees centigrade. In general, the amount of heat reduced is proportional to power output of the semiconductor chip. Therefore, the higher performance the semiconductor, the more power it dissipates, and the larger reduction in junction temperature.

In one embodiment, cap 216 may be implemented with nozzles for spray cooling. In some embodiments, radial nozzles and open pipes may be used where impinging jets are used. Spray cooling, which uses condensation to remove heat from the device, is generally more effective than traditional liquid cooling which utilizes convection cooling. Using a cap with built-in inlet nozzles, the nozzles may spray a fine mist of coolant onto the lid structure. The liquid coolant picks up heat and evaporates, cooling the device. The size of the nozzles may vary. In general, any suitable cooling nozzles for electronic cooling may be used. Depending on the effectiveness of the heat transfer and the heat transfer requirements, a spray cooled system may eliminate fins or use micron sized fins instead of protruding fins on the bottom piece that is integrated into lid 210. Other types of cooling may be used, e.g., air cooling.

Figure 2B:
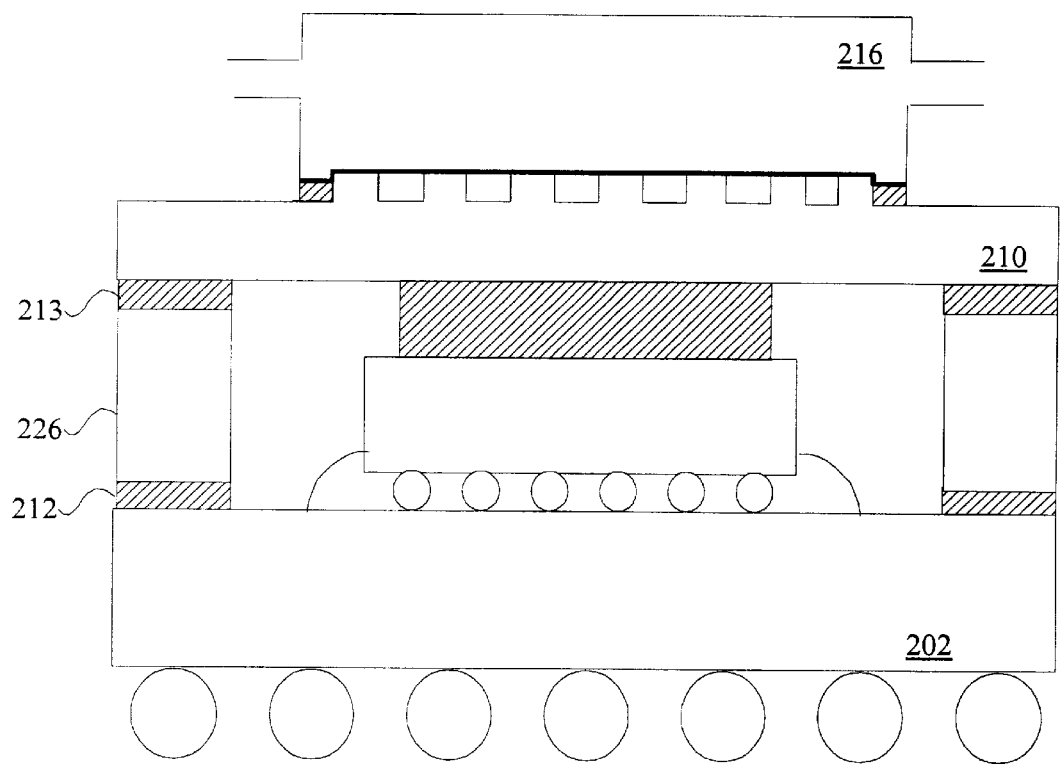
FIG. 2B illustrates an alternative embodiment of an integrated circuit device package integrated with a cold plate.

FIG. 2B illustrates an alternative embodiment of an integrated circuit device package is integrated with the bottom piece of a cold plate. In this embodiment, lid 210 is flat. A ring 226 is coupled to lid 210 via an adhesive 213. Ring 226 may be made of a material similar to lid 210. Adhesive 213 may be similar to adhesive 212 described above. Ring 226 is coupled to substrate 202 via adhesive 212. Other construction may be used to provide mechanical rigidity to structure 200.

Figure 3:
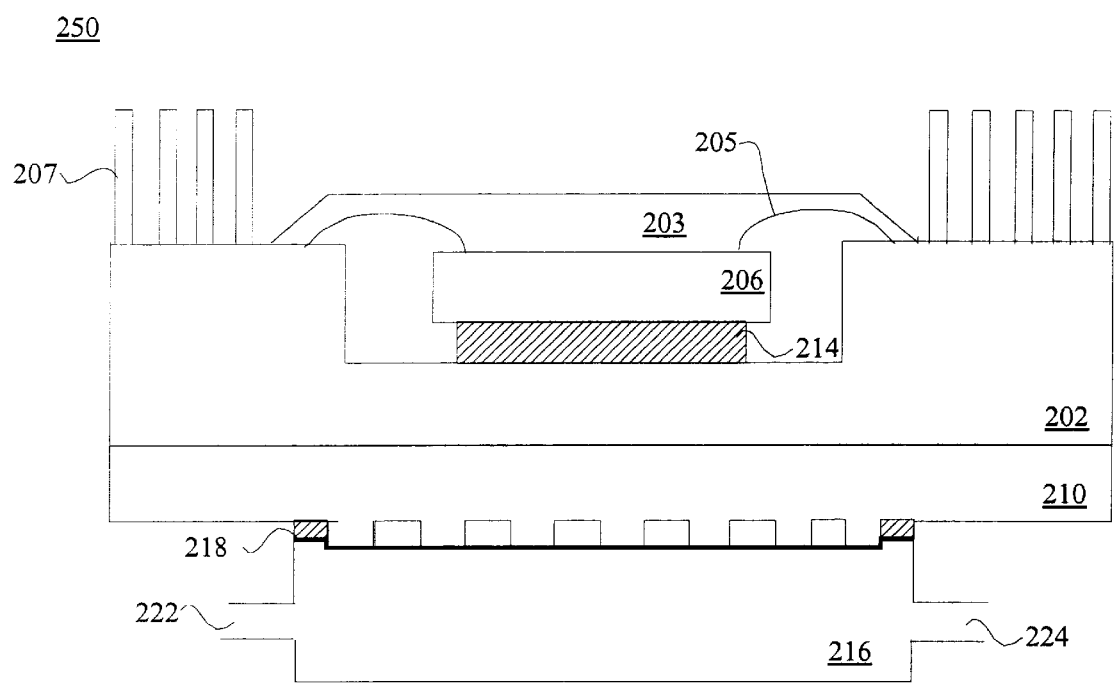
FIG. 3 illustrates a cavity down wire bond pin grid array package integrated with a cold plate.

Although FIGS. 2A and 2B show a BGA (Ball Grid Array) packaging method, other types of package may be used, for example, wire bond BGA, Pin Grid Array (PGA), Land Grid Array (LGA ) or ceramic column grid array (CCGA). FIG. 3 shows a "cavity down" pin grid array package 250 in accordance with one embodiment of the present invention. In this embodiment, bond wires 205 provide electrical connections between substrate 202 and semiconductor chip 206. Semiconductor chip 206 and bond wires 205 may be protected with an encapsulant 203. Encapsulant 203 may be, for example, a potting resin such as an epoxy resin similar to that used in a plastic package. The encapsulant can be provided by screen printing or other known techniques. Pins 207 provide electrical connections between substrate 202 and a, e.g., PCB (not shown). In this embodiment, the bottom piece of a cold plate is integrated with substrate 202 in a manner similar to that described above. Cap 216 with an inlet 222 and an outlet 224 is then attached to the lid 210 using adhesive 218. Those skilled in the art would recognize other variations. For example, a metal or ceramic lid may be used instead of the encapsulant, with solder or adhesive to attach the lid to substrate 202.

Figure 4:
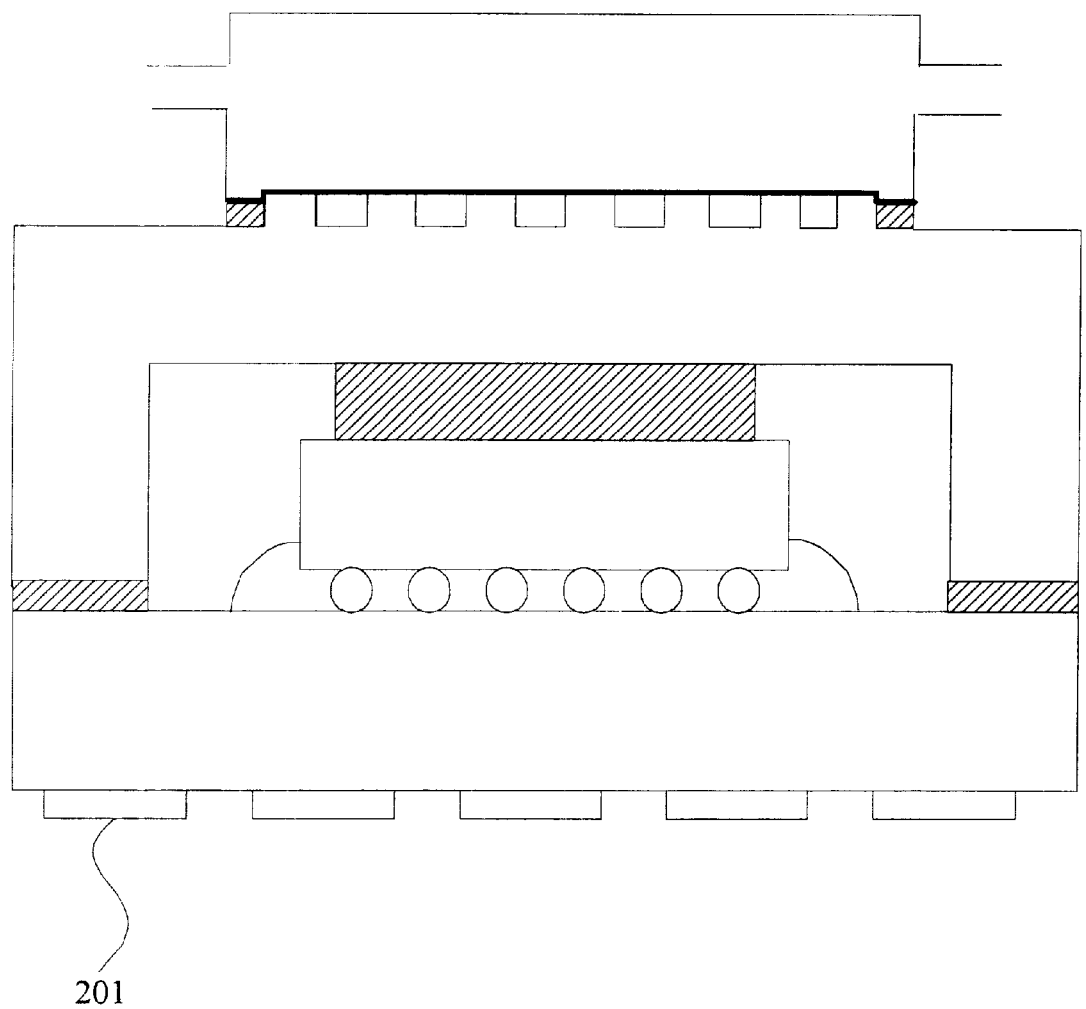
FIG. 4 illustrates a cavity up flip-chip land grid array package integrated with a cold plate.

FIG. 4 shows a cavity up flip-chip LGA package 300 in accordance with one embodiment of the present invention. An LGA package is similar to that of a BGA package shown in FIGS. 2A and 2B, except that LGA does not use solder balls for connection to, e.g., a PCB. Instead, pads 201 are used for electrical connections. Pads 201 may be formed using any known method.

In general, any integrated circuit device package in which there is contact (either direct or indirect) between the die and a thermally conductive body that forms the top surface of the package opposing the contact side may benefit from the method and structure described above which may be implemented in various systems. For example, the above described structures may be mounted on a PCB which may be the motherboard for a computer.

While the present invention has been described with reference to particular figures and embodiments, it should be understood that the description is for illustration only and should not be taken as limiting the scope of the invention. Many changes and modifications may be made to the invention, by one having ordinary skill in the art, without departing from the spirit and scope of the invention. For example, additional heat dissipation members may be added to enhance heat dissipation of the integrated circuit device. Additionally, different heat dissipation member such as a heat sink or a heat spreader may be integrated with the lid. Furthermore, although the invention has been described in a particular orientations, words like "above," "below," "overlying," "up," "down," etc. should not be construed to require any absolute orientation.

We claim:

1. An integrated circuit device, comprising:
    a substrate;
    a lid coupled to the substrate forming a closed cavity, the lid having a plurality of fins protruding from an outer surface of the lid;
    a die attached to an inner surface of the lid inside the cavity; and
    a cap having an inlet and outlet, the cap being attached to the lid through an adhesive around the perimeter of the cap.

2. The integrated circuit of claim 1, wherein the lid and the cap are configured to function as a cold plate.

3. The integrated circuit of claim 1, wherein the cap is configured for spray cooling.

4. The integrated circuit of claim 1, wherein the inner surface is planar, further comprising a ring attached between the lid and the substrate, the ring configured to form a sidewall of the enclosed cavity.

5. An integrated circuit device, comprising:
    an integrated circuit device package, comprising:
        a substrate; and
        a thermally conductive lid coupled to a first surface of the substrate, the thermally conductive lid and the substrate forming a closed cavity which contains an integrated circuit die attached to an inner surface of the lid; and
    a heat dissipation member attached to an outer surface of the lid around a perimeter of the heat dissipation member through an adhesive, the heat dissipation member and the lid being configured to function as a cold plate.

6. The integrated circuit device of claim 5, wherein the heat dissipation member is configured for spray cooling.

7. The integrated circuit device of claim 5, wherein the lid comprises a plurality of fins protruding from the first surface.

8. An integrated circuit device, comprising:
    a semiconductor chip mounted on a first surface of a substrate;
    a thermally conductive lid, the thermally conductive lid and the substrate forming a closed cavity which encloses the semiconductor chip, the semiconductor chip being attached to an inner surface of the thermally conductive lid; and a cap, the cap being attached to the thermally conductive lid at an outer perimeter of the cap, the cap and the lid being configure to function as a cold plate.

9. The integrated circuit device of claim 8, wherein the semiconductor chip is mounted in a flip-chip configuration.

10. The integrated circuit device of claim 8, wherein the cap is configured for spray cooling.

11. The integrated circuit device of claim 8, wherein the lid comprises a plurality of channels.

12. An electronic system having an integrated circuit device, the integrated circuit device comprising:

a substrate;

a thermally conductive lid, the thermally conductive lid and the substrate forming a closed cavity which encloses a semiconductor chip, the semiconductor chip being attached to a first surface of the lid; and a cap, the cap being attached to a second surface of the thermally conductive lid at the outer perimeter of the cap, the cap and the lid being configured to function as a cold plate.

13. The electronic system of claim 12, wherein the thermally conductive lid comprises a plurality of fins protruding from the second surface.

14. A method of dissipating heat for an integrated circuit device package, comprising:

mounting an integrated circuit die on a substrate;

mounting a lid on the substrate, such that the lid and the substrate form a closed cavity which surrounds the integrated circuit die;

attaching the integrated circuit die to the lie; and mounting a cap on the lid around the outer perimeter of the cap, such that the lid and the cap function as a cold plate.

15. The method of claim 14, wherein the lid and the cap form a plurality of channels, the cap comprising an inlet and an outlet, further comprising passing coolant from the inlet through the channels to the outlet.

16. The method of claim 14, further comprising configuring the cap for spray cooling.

17. The method of claim 14, further comprising shaping a surface of the lid to include fins protruding from the surface.

* * * * *